United States Patent [19]
Schmitt et al.

[11] Patent Number: 6,130,556
[45] Date of Patent: Oct. 10, 2000

[54] INTEGRATED CIRCUIT I/O BUFFER WITH 5V WELL AND PASSIVE GATE VOLTAGE

[75] Inventors: Jonathan Schmitt, Bloomington, Minn.; Gary Hom, Fremont; Luong Hung, Cupertino, both of Calif.

[73] Assignee: LSI Logic Corporation, Milpitas, Calif.

[21] Appl. No.: 09/098,099

[22] Filed: Jun. 16, 1998

[51] Int. Cl.[7] .............................................. H03K 19/0185
[52] U.S. Cl. ................................. 326/81; 326/58; 326/86
[58] Field of Search ................................. 326/68, 80–81, 326/56–58, 83, 86, 121

[56] References Cited

U.S. PATENT DOCUMENTS

| | | | |
|---|---|---|---|
| 5,266,849 | 11/1993 | Kitahara et al. . | |
| 5,300,832 | 4/1994 | Rogers . | |
| 5,321,324 | 6/1994 | Hardee et al. . | |
| 5,338,978 | 8/1994 | Larsen et al. . | |
| 5,381,062 | 1/1995 | Morris | 326/68 |
| 5,406,141 | 4/1995 | Yero et al. | 326/68 |
| 5,410,267 | 4/1995 | Haycock et al. | 326/81 |
| 5,418,476 | 5/1995 | Strauss | 326/58 |
| 5,450,025 | 9/1995 | Shay | 326/81 |
| 5,467,031 | 11/1995 | Nguyen et al. | 326/81 |
| 5,537,059 | 7/1996 | Asahina | 326/81 |
| 5,559,464 | 9/1996 | Orii et al. | 327/333 |
| 5,723,987 | 3/1998 | Ronen | 326/81 |
| 5,736,869 | 4/1998 | Wei | 326/81 |
| 5,929,667 | 7/1999 | Abadeer et al. | 326/83 |

OTHER PUBLICATIONS

Sedra et al. Microelectronic Circuits & Devices. Prentice Hall, p. 343, 1987.

*Primary Examiner*—Jon Santamauro
*Attorney, Agent, or Firm*—Westman, Champlin & Kelly, P.A.

[57] ABSTRACT

An integrated circuit buffer includes a core output terminal, a pad terminal, a pad pull-down transistor, a pad pull-up transistor, a pull-down control circuit and a pull-up control circuit. The pad pull-down transistor and the pad pull-up transistor are coupled to the pad terminal and have pull-up and pull-down control terminals, respectively. The pull-down control circuit is coupled between the core output terminal and the pull-down control terminal. The pull-up control circuit is coupled between the core output terminal and the pull-up control terminal. A pull-up voltage protection transistor is coupled in series between the pad pull-up transistor and the pad terminal and has a control terminal which is coupled to the pad terminal through a voltage feedback circuit.

15 Claims, 4 Drawing Sheets

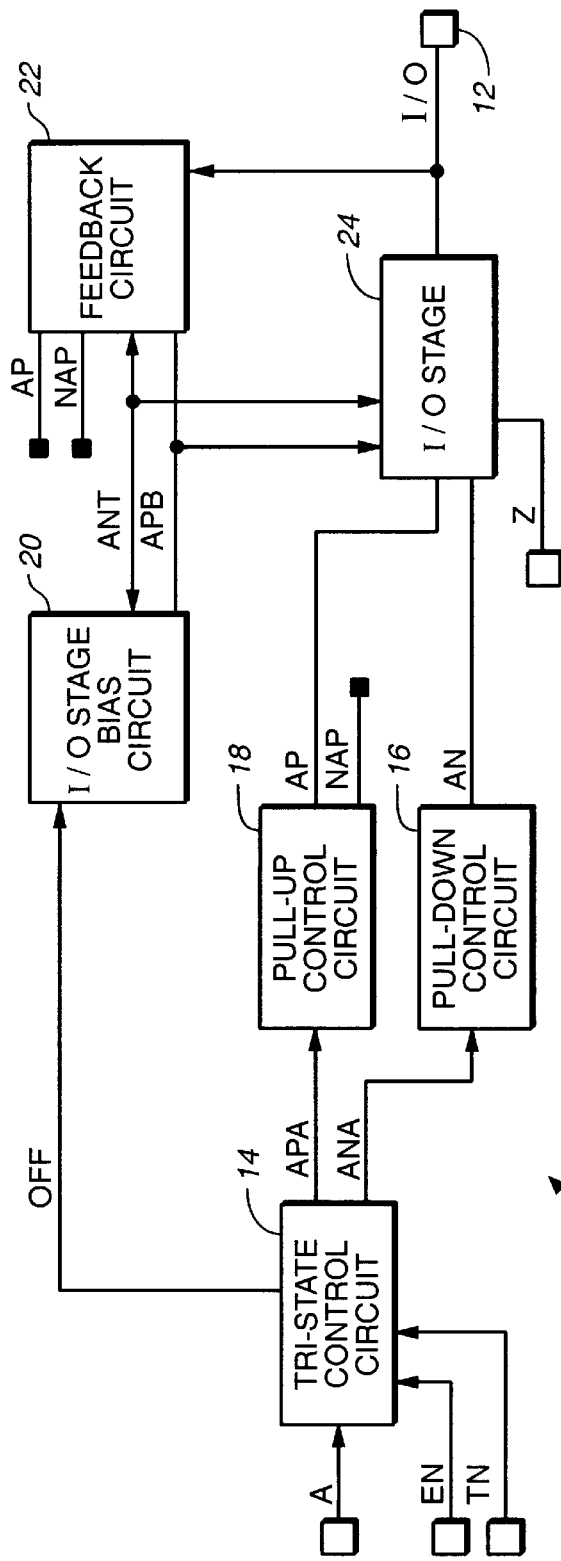
*FIG._1*
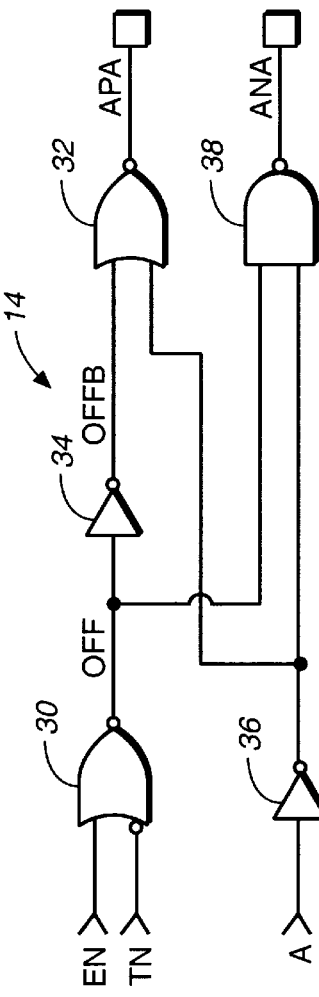
*FIG._2*

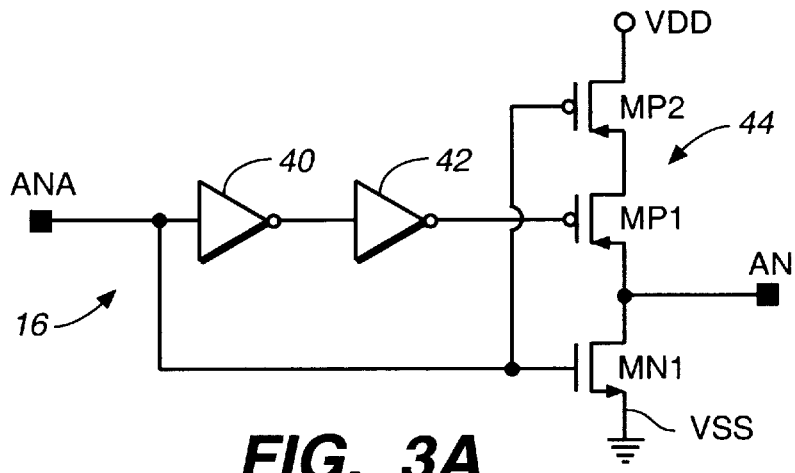
FIG._3A
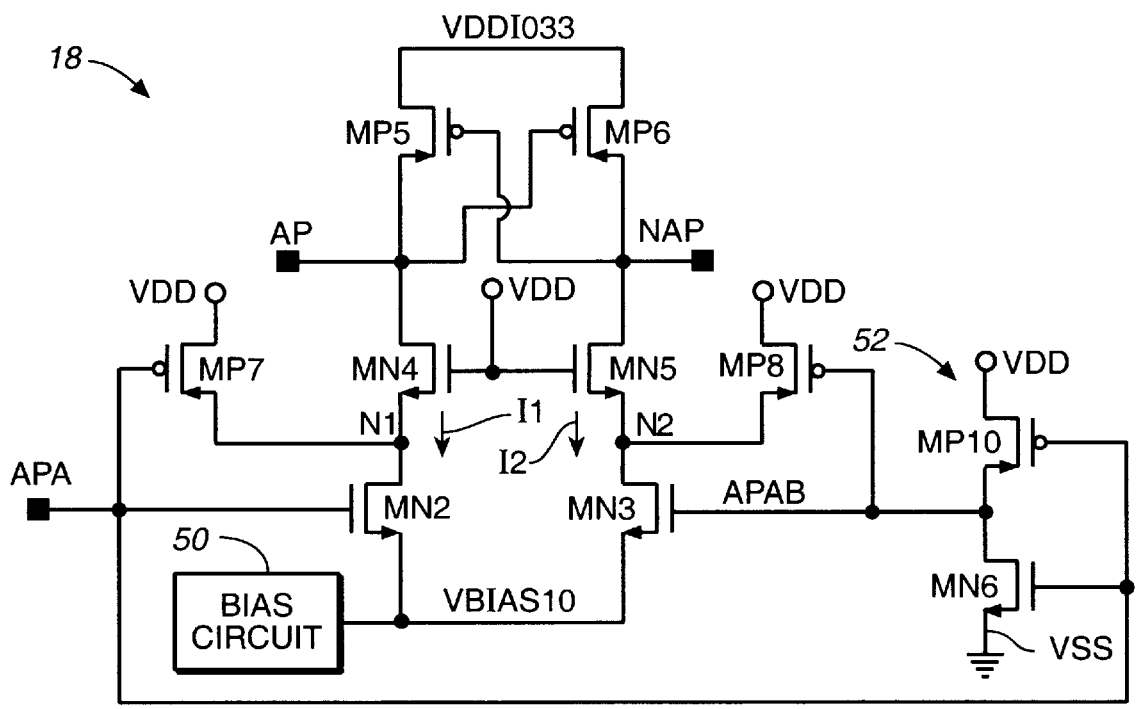
FIG._3B

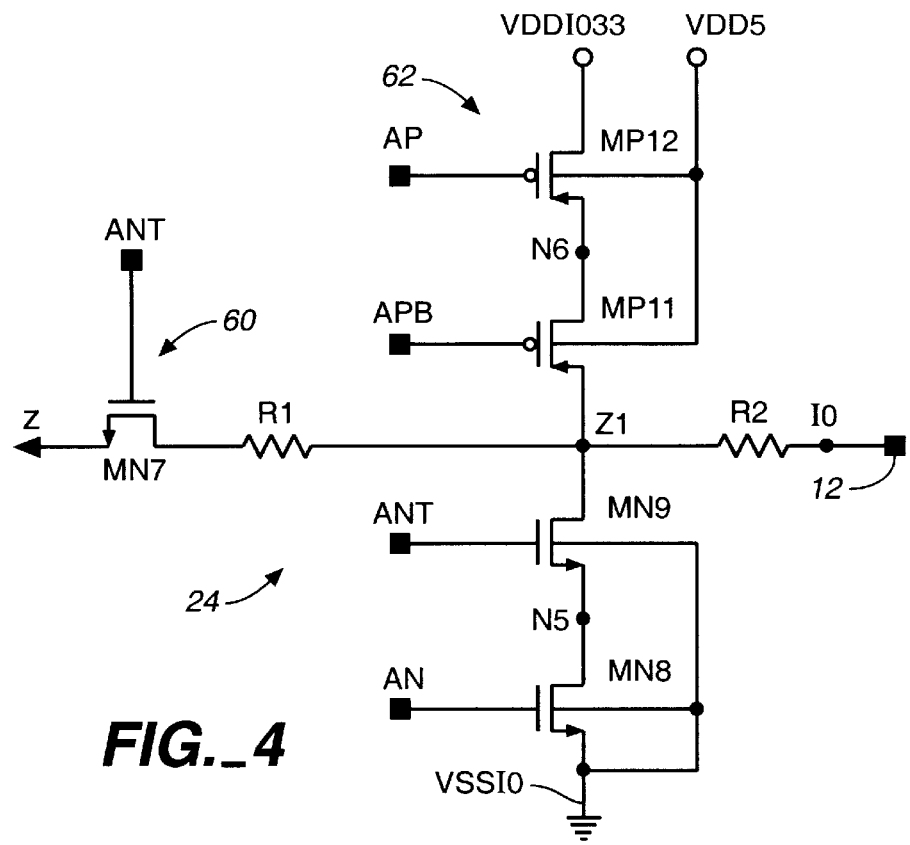
FIG._4
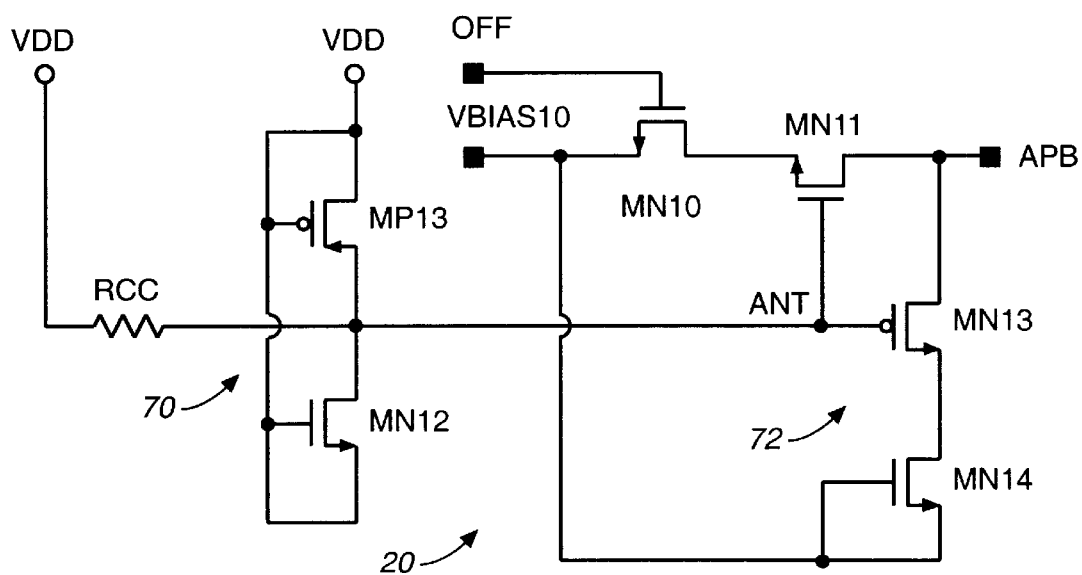
FIG._5

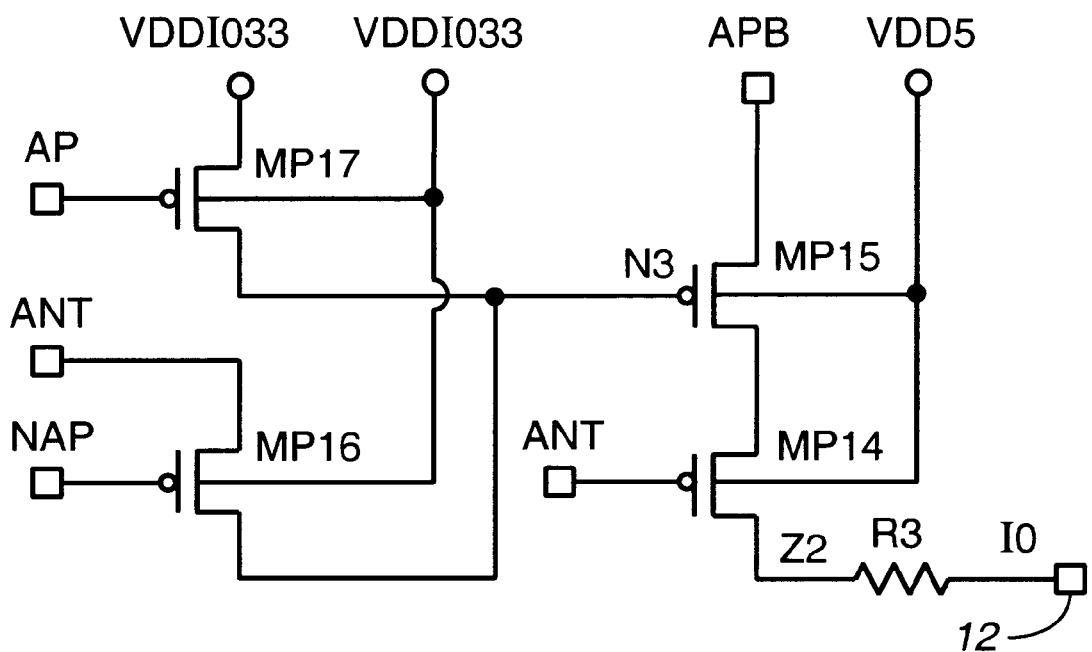
FIG._6

INTEGRATED CIRCUIT I/O BUFFER WITH 5V WELL AND PASSIVE GATE VOLTAGE

CROSS-REFERENCE TO RELATED APPLICATION

Cross-reference is hereby made to co-pending U.S. application Ser. No. 08/927,358, entitled "5V TOLERANT PCI I/O BUFFER ON 2.5V TECHNOLOGY," filed Sep. 9, 1997, and U.S. application Ser. No. 09/061,972, entitled "INTEGRATED CIRCUIT I/O BUFFER HAVING PASS GATE PROTECTION WITH RC DELAY," filed Apr. 17, 1998.

BACKGROUND OF THE INVENTION

The present invention relates to semiconductor integrated circuits and, more particularly, to a 5V tolerant PCI input-output (I/O) buffer which is fabricated on 2.5V technology and drives a 3.3V output signal without exceeding transistor tolerances.

CMOS integrated circuits are typically provided with tri-state I/O buffers that are selectively operable between a normal, low-impedance drive mode and a high-impedance, tri-state mode in which the buffers appear transparent to the output terminals with which they are connected. Advancements in semiconductor fabrication technology enable the geometries of semiconductor devices to be progressively reduced so that more devices can fit on a single integrated circuit. As a result, core voltages of integrated circuits are being reduced to prevent damage to the small devices and to reduce overall power consumption. For example, power supplies are now being reduced from 5V to 3.3V, and from 3.3V to 2.5V.

However, low voltage CMOS devices are often interconnected at a board level to TTL logic and other devices that operate at higher supply voltages of 5V or 3.3V. For example, buffer specifications for peripheral component interfaces (PCIs) require the buffers to be tolerant to input signals having the steady state PCI voltage, such as 5V. Also, these buffers may be exposed to reflections up to 11V or down to −5.25V for a 5V PCI voltage.

Diodes have been placed on the pad terminals of I/O buffers to clamp input spikes at or near the worst case PCI voltage, such as about 5.5V for a 5V PCI. If no further precautions are taken, a clamped 5.5V signal applied to the pad terminal of a 2.5V tri-state output buffer can cause voltage drops across the transistor devices in the buffer that exceed the transistor tolerances, which can cause the gate oxide of the devices to breakdown. It is therefore desirable to provide an I/O buffer that is tolerant to large pad voltages without exceeding the tolerance levels of the devices within the buffer.

SUMMARY OF THE INVENTION

The integrated circuit buffer of the present invention includes a core output terminal, a pad terminal, a pad pull-down transistor, a pad pull-up transistor, a pull-down control circuit and a pull-up control circuit. The pad pull-down transistor and the pad pull-up transistor are coupled to the pad terminal and have pull-up and pull-down control terminals, respectively. The pull-down control circuit is coupled between the core output terminal and the pull-down control terminal. The pull-up control circuit is coupled between the core output terminal and the pull-up control terminal. A pull-up voltage protection transistor is coupled in series between the pad pull-up transistor and the pad terminal and has a control terminal which is coupled to the pad terminal through a voltage feedback circuit.

Another aspect of the present invention relates to a method of operating the integrated circuit buffer, including: operating the tri-state buffer in a low-impedance drive mode in which the pad pull-down and pad pull-up transistors are biased to selectively couple the pad terminal to a first supply voltage and a second, higher supply voltage through the pad pull-down and pad pull-up transistors, respectively; operating the tri-state buffer in a high-impedance, tri-state mode in which the pad pull-up and pad pull-down transistors are biased are in an off state; coupling a voltage on the pad terminal to a control terminal of the pull-up voltage protection transistor through a feedback path when the tri-state buffer is in the high-impedance, tri-state mode and the voltage on the pad terminal exceeds a selected voltage level; and decoupling the voltage on the pad terminal from the control terminal of the pull-up voltage protection transistor through the feedback path when the voltage on the pad terminal is less than the selected voltage level.

In one embodiment of the present invention, operating the tri-state buffer in a low-impedance drive mode includes coupling the control terminal of the pull-down voltage protection transistor to a first bias voltage, which is greater than the first supply voltage and less than the second supply voltage, and coupling the control terminal of the pad pull-up transistor to a second bias voltage, which is less than the first bias voltage and greater than the first supply voltage. Operating the tri-state buffer in the high-impedance, tri-state mode includes decoupling the control terminal of the pad pull-up transistor from the second bias voltage.

The substrate terminal of the pad pull-down transistor and the pull-down voltage protection transistor are coupled to the first supply voltage. The well terminal of the pad pull-up transistor and the pull-up voltage protection transistor are coupled to a third supply voltage which is greater than the first and second supply voltages.

BRIEF DESCRIPTION OF THE DRAWINGS

FIG. 1 is a simplified block diagram of a tri-state input-output (I/O) buffer according to one embodiment of the present invention.

FIG. 2 is a logic diagram of a tri-state control circuit within the I/O buffer shown in FIG. 1.

FIGS. 3A and 3B are schematic diagrams of a pull-down and a pull-up control circuit, respectively, within the I/O buffer shown in FIG. 1.

FIG. 4 is a schematic diagram of an I/O stage within the I/O buffer shown in FIG. 1.

FIG. 5 is a schematic diagram of an I/O stage bias circuit within the I/O buffer shown in FIG. 1.

FIG. 6 is a schematic diagram of a voltage feedback circuit within the I/O buffer shown in FIG. 1.

DETAILED DESCRIPTION OF THE PREFERRED EMBODIMENTS

FIG. 1 is a simplified block diagram of a tri-state input-output (I/O) buffer according to one embodiment of the present invention. I/O buffer 10 forms part of an integrated circuit which has been fabricated with a 2.5V CMOS fabrication process, for example. I/O buffer 10 receives a 0–2.5V data signal from the core of the integrated circuit on data terminal A and, in response, drives a 0–3.3V output signal on I/O pad 12. Also, I/O buffer 10 receives 0–2.5V, 0–3.3V or 0–5V data signals on I/O pad 12 and supplies 0–2.5V data signals on data terminal Z. Each transistor in I/O buffer 10 is biased such that the gate-to-source and gate-to-drain voltages are all less than a 3.0V tolerance and the drain-to-source voltages are all less than a 2.75V tolerance to prevent damage to the transistors while driving or receiving signals on I/O pad 12.

I/O buffer 10 includes tri-state control circuit 14, pull-down control circuit 16, pull-up control circuit 18, I/O stage bias circuit 20, feedback circuit 22 and I/O stage 24. Tri-state control circuit 14 receives a 0V–2.5V data signal on data terminal A and receives enable signals on enable terminals EN and TN, each of which has an enable state and a disable state. Tri-state control circuit 14 generates a 0V–2.5V pull-down control signal on terminal ANA and a 0V–2.5V pull-up control signal on terminal APA which follow the logic state of the 0V–2.5V data signal applied to data terminal A when the enable signals applied to enable terminals EN and TN are both in the enable state, which is logic low and high, respectively. When either the enable signal on enable terminal EN is high or the enable signal on enable terminal TN is low, tri-state control circuit 14 drives the pull-down control signal on terminal APA low and the pull-up control signal on terminal ANA high to disable I/O buffer 10. Tri-state control circuit 14 also generates a 0V–2.5V tri-state control signal on terminal OFF, which is applied to I/O stage bias circuit 20.

Pull-down control circuit 16 receives the 0V–2.5V pull-down control signal on terminal ANA and generates a delayed and inverted 2.5V–0V pull-down control signal on terminal AN, which is applied to I/O stage 24. Pull-up control circuit 18 receives the 0V–2.5V pull-up control signal on terminal APA and generates a level-shifted and inverted 3.3V–0.8V pull-up control signal on terminal AP, which is applied to I/O stage 24 and to feedback circuit 22. Pull-up control circuit 18 also generates a non-inverted 0.8–3.3V signal on terminal NAP, which is applied to feedback circuit 22.

I/O stage 24 selectively pulls I/O pad 12 high substantially to 3.3V in response to a 0.8V level on pull-up control terminal AP. I/O stage 24 selectively pulls I/O pad 12 low substantially to 0V in response to a 2.5V level on pull-up control terminal AN. When the enable signal on enable terminal EN is high or the enable signal on enable terminal TN is low, the pull-up control signal on terminal AP will be 3.3V and the pull-down control signal on terminal AN will be 0V causing I/O stage 24 to operate in a tri-state or high impedance mode in which the I/O stage appears transparent to I/O pad 12. When in the tri-state mode, I/O stage 24 applies data signals received on I/O pad 12 to core terminal Z for processing by the integrated circuit on which I/O buffer 10 is fabricated.

I/O stage bias circuit 20 generates bias voltages on bias terminals ANT and APB, which are applied to I/O stage 24. When buffer 10 is in the drive mode, I/O stage bias circuit 20 loosely drives the bias voltage on bias terminal ANT to a selected level, such as 2.5V, and drives bias voltage APB to a selected level, such as 0.8V.

When buffer 10 is in the tri-state mode, I/O stage bias circuit 20 allows the bias voltage on bias terminal ANT to rise with a rise in the voltage on I/O pad 12 through capacitive coupling. This protects semiconductor devices within I/O stage 24 from a possible over-voltage condition, which may otherwise occur by maintaining bias voltage terminal ANT at a fixed voltage as described in more detail below. Also, tri-state control signal OFF disables I/O stage bias circuit 22 from driving bias terminal APB. This allows feedback circuit 22 to increase the voltage on bias terminal APB when feedback circuit 22 senses that the voltage on I/O pad 12 rises above a selected threshold, such as 2.5V. By increasing the voltage on bias voltage terminal APB, feedback circuit 22 prevents leakage current through the pull-up devices in I/O stage 24, which is also described in more detail below.

Tri-State Control Circuit 14

FIG. 2 is a logic diagram of tri-state control circuit 14. Tri-state control circuit 14 includes enable terminals EN and TN, data input A, control terminals APA and ANA, NOR gates 30 and 32, inverters 34 and 36 and NAND gate 38. During drive mode, the enable signal applied to enable terminal EN is low and the enable signal applied to enable terminal TN is high. Tri-state control terminal OFF at the output of NOR gate 30 is high, and the data signals applied to data terminal A pass to control terminals APA and ANA. When either enable terminal EN is high or enable TN is low, tri-state control terminal OFF is low. NOR gate 32 drives terminal APA to a logic low state and NAND gate 38 drives terminal ANA to a logic high state. Control terminals OFF, APA and ANA have voltage ranges of 0V–2.5V.

Pull-down and Pull-up Control Circuits 16 and 18

FIGS. 3A and 3B are schematic diagrams of pull-down control circuit 16 and pull-up control circuit 18, respectively. Pull-down control circuit 16 includes inverters 40, 42 and 44 which are coupled together in series between control terminal ANA and pull-down control terminal AN. Inverter 44 includes three transistors, N-channel transistor MN1 and P-channel transistors MP1 and MP2, to allow bypassing of the delay line formed by inverters 40 and 42 during a low-to-high transition on terminal ANA. A high-to-low transition passes through the delay line before pulling terminal AN high through transistors MP1 and MP2. This prevents I/O stage 24 (shown in FIG. 1) from pulling I/O pad 12 low and high at the same time, as discussed in greater detail below. Inverters 40, 42 and 44 are biased between voltage supply terminals VDD and VSS. Voltage supply terminals VDD and VSS are coupled to an external power supply (not shown) which provides a 2.5V core supply voltage. This supply voltage is also used to bias the elements within tri-stage control circuit 14. The pull-down control signals generated on terminal AN therefore have a voltage swing of about 0V–2.5V.

Pull-up control circuit 18 is a voltage level shifting differential amplifier and includes bias circuit 50, inverter 52, N-channel differential transistor pair MN2 and MN3, N-channel voltage protection transistors MN4 and MN5, P-channel cross-coupled transistor pair MP5 and MP6 and P-channel charge boosting transistors MP7 and MP8. Bias circuit 50 generates a bias voltage of about 0.8V on voltage bias terminal VBIAS10. Bias circuit 50 can include any suitable bias generator, such as a resistor tree, a biased current source, a self-fed inverter or a voltage regulator. An example of a suitable bias generator is disclosed in U.S. Ser. No. 08/906,305, filed Aug. 5, 1997 and entitled "OUTPUT BUFFER WITH REGULATED VOLTAGE BIASING FOR DRIVING VOLTAGES GREATER THAN TRANSISTOR TOLERANCE," which is assigned to the same assignee as the present application and is hereby incorporated by reference.

The pull-up control signals received on terminal APA are applied to the gate, or control terminal, of transistor of MN2 and are applied to the gate of transistor MN3, at terminal APAB, through inverter 52. Inverter 52 includes N-channel transistor MN6 and P-channel transistor MP10 which are coupled together in series between voltage supply terminal VDD and voltage supply terminal VSS. The gates of transistors MN2 and MN3 therefore receive complementary 0V–2.5V pull-up control signals on terminals APA and APAB.

The sources of transistors MN2 and MN3 are coupled to bias terminal VBIAS10, and the drains of transistors MN2 and MN3 define first and second current paths I1 and I2 through nodes N1 and N2, respectively. Voltage protection transistor MN4 is coupled in series between pull-up control terminal AP and node N1. Voltage protection transistor MN5 is coupled in series between control terminal NAP and node N2. Control terminal NAP has a voltage which is logically inverted from control terminal AP. The gates of transistors MN4 and MN5 are coupled to voltage supply terminal VDD. Transistors MP5 and MP6 are cross coupled with one another. Transistor MP5 has a gate coupled to control terminal NAP, a drain coupled to control terminal AP and a source coupled to voltage supply terminal VDDIO33. Transistor MP6 has a gate coupled to control terminal AP, a drain coupled to control terminal NAP and a source coupled to voltage supply terminal VDDIO33. Voltage supply terminal VDDIO33 is coupled to an external power supply (not shown) which provides a 3.3V I/O supply voltage on voltage supply terminal VDDIO33.

Charge boosting transistor MP7 is a pull-up transistor which is coupled between voltage supply terminal VDD and node N1 and is controlled by terminal APA. Charge boosting transistor MP8 is a pull-up transistor which is coupled between voltage supply terminal VDD and node N2 and is controlled by terminal APAB. The substrates of transistors MN2–MN6 are coupled to voltage supply terminal VSS. The substrates of transistors MP5 and MP6 are coupled to voltage supply terminal VDDIO33. The substrates of transistors MP7, MP8 and MP10 are coupled to voltage supply terminal VDD.

In drive mode, pull-up control circuit 18 receives a 0V–2.5V pull-up control signal on terminal APA and generates an inverted and level shifted 3.3V–0.8V pull-up control signal on pull-up control terminal AP. Pull-up control circuit 18 also generates a non-inverted and level shifted 3.3V–0.8V control signal on control terminal NAP.

If the pull-up control signal terminal APA is high, transistor MN2 will be on and transistor MN3 will be off. Transistor MN2 pulls current through current path I1 which discharges node N1 and terminal AP toward the voltage level on bias terminal VBIAS10, which is at about 0.8V. The voltage level on bias terminal VBIAS10 prevents terminal AP from discharging below 0.8V, which prevents an over-voltage condition on transistors MP5 and MP6 that would otherwise occur with the drains of these transistors being tied to 3.3V.

The low voltage on terminal AP turns on transistor MP6 which charges control terminal NAP and node N2 toward 3.3V. Charge boosting transistor MP8 assists transistor MP6 in charging node N2 when the voltage on terminal APA is high. The high voltage on control terminal NAP turns off transistor MP5. As node N2 reaches about 2.0V, transistor MN5 turns off since its gate is tied to 2.5V and thereafter prevents further charging of node N2. This prevents node N2 from reaching 3.3V and an over-voltage condition with respect to the gate of transistor MN3, which is at 0V.

When the pull-up control signal on terminal APA goes low, transistor MN2 turns off and transistor MN3 turns on. Transistor MN3 discharges control terminal NAP and node N2 toward 0.8V. The low voltage at control terminal NAP turns on transistor MP5, which charges node N1 and control terminal AP toward 3.3V and turns off transistor MP6. Charge boosting transistor MP7 assists transistor MP5 in charging node N1 when the voltage on terminal APA is low. As node N1 reaches about 2.0V, transistor MN4 turns off since its gate is tied to 2.5V. This prevents further charging of node N1 and thereby protects transistor MN2 from an over-voltage condition. Pull-up control circuit 18 therefore receives 0V–2.5V pull-up control signals on terminal APA and, in response, generates inverted and level shifted 3.3V–0.8V pull-up control signals on terminal AP.

I/O Stage 24

FIG. 4 is a schematic diagram of I/O stage 24. I/O stage 24 includes input stage 60, output stage 62, polysilicon resistor R1 and electrostatic discharge (ESD) protection resistor R2. Input stage 60 includes N-channel input transistor MN7 which has a gate coupled to voltage supply terminal ANT, a source coupled to core terminal Z, a drain coupled to resistor R1 and a substrate coupled to voltage supply terminal VSSIO, which is a ground terminal for voltage supply terminal VDDIO33. Resistor R1 is coupled between the drain of transistor MN7 and I/O terminal Z1. Resistor R2 is coupled between I/O terminal. Z1 and I/O pad 12.

Output driver stage 62 includes N-channel pull-down transistor MN8, N-channel voltage protection transistor MN9, P-channel voltage protection transistor MP11 and P-channel pull-up transistor MP12. Pull-down transistor MN8 has a gate coupled to pull-up control terminal AN, a source coupled to voltage supply terminal VSSIO and a drain coupled to node N5. Voltage protection transistor MN9 has a gate coupled to control terminal ANT, a source coupled to node N5 and a drain coupled to I/O terminal Z1. Voltage protection transistor MP11 has a gate coupled to control terminal APB, a source coupled to node N6 and a drain coupled to I/O terminal Z1. Pull-up transistor MP12 has a gate coupled to terminal AP, a source coupled to voltage supply terminal VDDIO33 and a drain coupled to node N6. The substrates or "n-type wells" of transistors MP11 and MP12 are coupled to a voltage supply terminal VDD5. Voltage supply terminal VDD5 is coupled to an external voltage supply (not shown) which provides a 5.0V supply voltage on voltage supply terminal VDD5. The substrates of transistors MN8 and MN9 are coupled to voltage supply terminal VSSIO. Several output driver stages are often coupled together in parallel to provide extra drive strength through I/O pad 12 and to provide ESD protection.

In the drive mode, I/O stage bias circuit 20 drives control terminal APB to about 0.8V and control terminal ANT to about 2.5V. The pull-down and pull-up control signals on terminals AN and AP pull I/O pad 12 down substantially to 0V or up substantially to 3.3V through output driver stage 62, depending on the logic state of the data signals received on data terminal A (shown in FIGS. 1–2). Pull-down transistor MN8 is driven with a voltage level of 0V–2.5V while pull-up transistor MP12 is driven with a shifted voltage level of 0.8V–3.3V. This protects pull-down transistor MN8 and pull-up transistor MP12 from gate-to-source, gate-to-drain and gate-to-bulk voltage drops of greater than 3.0V.

When terminal AP is low at 0.8V, pull-up transistor MP12 turns on and charges node N6, I/O terminal Z1 and node N5 toward 3.3V. Terminal AN is low at 0V, which turns off pull-down transistor MN8. As node N5 reaches about 2.0V, voltage protection transistor MN9 turns off since its gate is tied to 2.5V. This prevents further charging of node N5, which protects pull-down transistor MN8 from an over voltage condition. Since control terminal APB is at 0.8V in drive mode, the gate-to-source and gate-to-drain voltages of transistor MP11 are kept to less than the transistor tolerance of 3.0V when node N6 and I/O pad 12 are charged to 3.3V.

When pull-up control terminal AP goes high to 3.3V, pull-up transistor MP12 turns off. The delay line formed by inverters 40, 42 and 44 (shown in FIG. 3A) prevent pull-down control terminal AN from going high until pull-up transistor MP12 has turned off. This prevents transistors MP12 and MN8 from being on at the same time. Pull-down transistor MN8 turns on and discharges node N5, I/O terminal Z1 and node N6 toward 0V. As node N6 drops below the voltage on the gate of voltage protection transistor MP11, transistor MP11 turns off preventing further discharge of node N4 and an over voltage condition on pull-up transistor MP12, which has its source coupled to 3.3V.

In the tri-state mode, data signals received on I/O pad 12 are transmitted through input transistor MN7 to core terminal Z. Pull-down control circuit 16 (shown in FIG. 3A) drives terminal AN to 0V and pull-up control circuit 18 (shown in FIG. 3B) drives terminal AP to 3.3V. Transistors MN8 and MP12 turn off, which isolates I/O terminal Z1 and I/O pad 12 from voltage supply terminals VDDIO33 and VSSIO.

For a 5V peripheral component interface (PCI) application, I/O stage 24 is preferably capable of tolerating a steady 5V data signal on I/O pad 12 and voltage spikes of up to 11V. Since the n-type well of voltage protection transistor MP11 is coupled to 5V through voltage supply terminal VDD5, the drain-to-well pn junction of transistor MP11 acts as a clamping diode which clamps voltage spikes on I/O pad 12 to about 5.5V. This protects the semiconductor devices within I/O stage 24 from voltages above 5.5V.

In addition, feedback circuit 22 feeds the voltage on I/O pad 12 back onto bias terminal APB when the voltage on I/O pad 12 exceeds a threshold voltage, such as 2.5V. This protects transistor MP11 from gate-to-drain voltage drops of greater than 3.0V when the data on I/O pad 12 is greater than 3.3V. This also ensures that the voltage on bias terminal APB is high enough that voltage protection transistor MP11 remains off when high voltages are applied to I/O pad 12 and thereby prevents leakage current from flowing through transistor MP11 to voltage supply terminal VDDIO33.

I/O stage bias circuit 20 allows the voltage on bias terminal ANT to rise with rises in the voltage in I/O terminal Z1. Bias terminal ANT at the gate of voltage protection transistor MN9 has a significant amount of coupling capacitance to I/O terminal Z1. Voltage spikes on I/O terminal Z1 therefore are capacitively coupled to ANT, causing the voltage on bias terminal ANT to follow the voltage on I/O terminal Z1. In accordance with one embodiment of the present invention, I/O stage bias circuit 20 couples a resistor in series between voltage supply terminal VDD and bias terminal ANT. The resistor and the coupling capacitance between I/O terminal Z1 and bias terminal ANT forms a resistor-capacitor (RC) circuit having a time constant which delays ANT from returning to the 2.5V level on voltage supply terminal VDD until after the voltage spike has disappeared on I/O terminal Z1. This prevents more than 3V from appearing across the gate and drain of voltage protection transistor MN9.

I/O Stage Bias Circuit 20

FIG. 5 is a schematic diagram of I/O stage bias circuit 20, which includes RC delay resistor RCC, clamp circuits 70 and 72, N-channel pass gate transistor MN10 and voltage protection transistor MN11. RC delay resistor RCC is coupled between voltage supply terminal VDD and bias terminal ANT for "loosely" driving bias terminal ANT to about 2.5V. RCC delay resistor forms an RC circuit with the coupling capacitance through the gate of voltage protection transistor MN9 (shown in FIG. 4) from voltage supply terminal VDD to I/O terminal Z1. The RC circuit has a time constant which is preferably at least as long as the expected duration of any voltage spikes that will be experienced on I/O terminal Z1. In one embodiment, the time constant is preferably at least 50 nanoseconds and most preferably at least 62 nanoseconds. Resistor RCC has a resistance which is preferably 5K Ohms to 100K Ohms and most preferably 20K Ohms to 100K Ohms. RC delay resistor RCC is formed by a low-doped well region on the integrated circuit, for example.

Clamp circuit 70 includes N-channel transistor MN12 and P-channel transistor MP13 which prevent bias terminal ANT from rising or falling too far from 2.5V. Clamp transistor MN12 has a gate and source coupled to voltage supply terminal VDD and a drain coupled to bias terminal ANT. If the voltage on bias terminal ANT drops much below 2.5V, transistor MN12 turns on and clamps the voltage on bias terminal ANT. Transistor MP13 has a gate and source coupled to voltage supply terminal VDD and a drain coupled to bias terminal ANT. If the voltage on bias terminal ANT rises much above 2.5V, transistor MP13 turns on and clamps the voltage on bias terminal ANT. In one embodiment, clamping transistors MN12 and MP13 allow bias terminal ANT to range from 1.8V to 3.2V. Clamping transistors MN12 and MP13 can be replaced with other clamping devices such as junction diodes.

Pass gate transistor MN10 and voltage protection transistor MN11 are coupled in series between bias terminal VBIAS10 and bias terminal APB. Pass gate transistor MN10 has a gate coupled to tri-state control terminal OFF, a source coupled to bias terminal VBIAS10 and a drain coupled to the source of voltage protection transistor MN11. Voltage protection transistor MN11 has a gate coupled to bias terminal ANT and a drain coupled to bias terminal APB. When the buffer is in drive mode, tri-state control terminal OFF is at 2.5V. Pass gate transistor MN10 is on and couples bias terminal APB to bias terminal VBIAS10 through voltage protection transistor MN11 so that I/O stage bias circuit drives bias terminal APB to about 0.8V.

In tri-state mode, tri-state control terminal OFF is at 0V, which turns off pass gate transistor MN10 and thereby decouples bias terminal APB from bias terminal VBIAS10. This allows feedback circuit 22 to drive bias terminal APB, as explained below. When the voltage on I/O pad 12 is high, feedback circuit may drive bias terminal APB up to about 6.0V, for example. The voltage on bias terminal APB also rises with I/O pad 12, as explained above, to about 3.2V. Voltage protection transistor MN11 turns off which prevents an over-voltage condition on transistor MN10 since its gate is tied to 0V and its drain is tied to 0.8V. Transistor MN11 is protected since its gate rises with bias terminal ANT.

Clamping circuit 72 includes voltage protection transistor MN13 and clamping transistor MN14. Voltage protection transistor MN13 operates to protect clamping transistor MN14 in a similar manner as voltage protection transistor MN11 operates to protect pass gate transistor MN10. Clamping transistor establishes a low-end voltage for bias terminal APB. When the drain of clamping transistor MN14 falls a turn-on threshold voltage below the voltage on VBIAS10, clamping transistor MN14 turns on, thereby clamping the voltage on bias terminal APB.

Feedback Circuit 22

FIG. 6 is a schematic diagram of feedback circuit 22. Feedback circuit 22 includes P-channel voltage protection transistor MP14, P-channel pass gate transistor MP15, P-channel bias transistors MP16 and MP17 and ESD protection resistor R3. ESD protection resistor R3 is coupled between I/O pad 12 and I/O terminal Z2. Voltage protection transistor MP14 and pass gate transistor MP15 are coupled in series between I/O terminal Z2 and bias terminal APB. The gate of voltage protection transistor MP14 is coupled to bias terminal ANT, and the gate of pass gate transistor MP15 is coupled to bias node N3. Bias transistor MP16 is coupled in series between bias terminal ANT and bias node N3 and has a gate coupled to control terminal NAP. Bias transistor MP17 is coupled in series between voltage supply terminal VDDIO33 and bias node N3 and has a gate coupled to control terminal AP. The well terminals of transistors MP14 and MP15 are coupled to voltage supply terminal VDD5. The well terminals of transistors MP16 and MP17 are coupled to voltage supply terminal VDDIO33.

In drive mode, I/O stage bias circuit 20 (shown in FIG. 5) drives bias terminal APB to 0.8V and bias terminal ANT to 2.5V, and pull-up control circuit 18 (shown in FIG. 3B) drives control terminals AP and NAP to complementary states based on the input data from core terminal A. If control terminal AP is high such that I/O stage 24 (shown in FIG. 4) drives I/O pad 12 low to 0V, control terminal NAP will be low at about 0.8V. Bias transistor MP16 will be on and bias transistor MP17 will be off. The gates of voltage protection transistor MP14 and pass gate transistor MP15 will be at 2.5V, and each transistor will be off and decouple bias terminal APB from I/O terminal Z2. If control terminal AP is low such that I/O stage 24 (shown in FIG. 4) drives I/O pad 12 high to 3.3V, voltage protection transistor MP14 may be on since its gate is at 2.5V. To keep pass gate transistor MP15 also off, bias transistor MP17 turns on and drives the gate of pass gate transistor MP15 up to 3.3V. This keeps feedback circuit 22 decoupled from bias terminal APB when the buffer is in drive mode.

In tri-state mode, control terminals AP and NAP are driven to 3.3V and 0.8V, respectively. Bias transistor MP17 is off, and bias transistor MP16 is on. Bias transistor MP16 drives the gate of pass gate transistor MP15 to 2.5V. Since the gates of voltage protection transistor MP14 and pass gate transistor MP15 are at 2.5V, any time the voltage on I/O terminal Z2 rises more than a semiconductor turn-on threshold voltage above 2.5V, transistors MP14 and MP15 turn on and pass the voltage on I/O terminal Z2 to bias terminal APB. This raises the gate voltage of voltage protection transistor MP11 in I/O stage 24 (shown in FIG. 4) to prevent leakage current from the high voltage on I/O pad 12 to voltage supply terminal VDDIO33.

CONCLUSION

The tri-state output driver of the present invention is tolerant to a steady 5V input signal and drives a 3.3V output signal on I/O pad 12 while preventing the semiconductor devices within the driver from experiencing more than 3V from gate-to-source, gate-to-drain or gate-to-bulk and 2.75V from source-to-drain. The tri-state output driver of the present invention is also capable of accepting voltage spikes of up to 11V through the use of an RC delay formed with a resistor and the coupling capacitance through the output driver stage. As a result, the tri-state output buffer of the present invention can be used on a 2.5V integrated circuit to interface with a 5V PCI buffer. The gate lengths of any transistors with risky drain-to-source voltages can be elongated for additional tolerance. The voltage protection features in the tri-state output driver of the present invention are implemented with only a few additional transistors which draw only a minimal amount of additional current as compared to a traditional output driver.

Although the present invention has been described with reference to preferred embodiments, workers skilled in the art will recognize that changes may be made in form and detail without departing from the spirit and scope of the invention. For example, the present invention can be implemented with various technologies, including CMOS, and can have a variety of circuit configurations. The terms "source" and "drain" as used in the specification are interchangeable. The transistors shown in the figures can include individual transistors or an array of transistors coupled together in parallel with one another. Also, the voltage supply terminals can be relatively positive or relatively negative, depending upon the particular convention adopted and the technology used and can include a power supply bus or a biased reference terminal having a voltage other than that of the power supply buses, for example. The terms "pull-up" and "pull-down" used in the specification and the claims are arbitrary terms and can refer either to a logic high level or a logic low level depending upon the relative levels of the voltage supply terminals. Likewise, the term "coupled" can include various types of connections or couplings and can include a direct connection or a connection through one or more intermediate components.

What is claimed is:

1. An integrated circuit buffer comprising:
   a core output terminal;
   a pad terminal;
   a pad pull-down transistor and a pad pull-up transistor which are coupled to the pad terminal and have pull-up and pull-down control terminals, respectively;
   a pull-down control circuit coupled between the core output terminal and the pull-down control terminal;
   a pull-up control circuit coupled between the core output terminal and the pull-up control terminal;
   a first, pull-up voltage protection transistor coupled in series between the pad pull-up transistor and the pad terminal and having a control terminal;
   a bias circuit coupled to the control terminal of the first, pull-up voltage protection transistor; and
   a voltage feedback circuit comprising a second voltage protection transistor and a pass gate transistor, which are coupled in series between the pad terminal and the control terminal of the first, pull-up voltage protection transistor.

2. The integrated circuit buffer of claim 1 wherein the voltage feedback circuit further comprises:
   means for passing a voltage from the pad terminal to the control terminal of the voltage protection transistor through the second voltage protection transistor and the pass gate transistor when the voltage exceeds a selected voltage level and for isolating the pad terminal from the control terminal of the voltage protection transistor when the voltage is less than the selected voltage level.

3. The integrated circuit buffer of claim 1 wherein:
   the pass gate transistor has a control terminal;
   the second voltage protection transistor is coupled between the pad terminal and the pass gate transistor and has a control terminal; and
   the voltage feedback circuit comprises a feedback control circuit, which is coupled to the control terminals of the pass gate transistor and the second voltage protection transistor.

4. The integrated circuit buffer of claim 3 wherein the feedback control circuit further comprises:
- a first bias voltage terminal coupled to the control terminal of the second voltage protection transistor for providing a first bias voltage;
- a second bias voltage terminal for providing a second bias voltage which is greater than the first bias voltage;
- a first bias transistor which is coupled in series between the first bias voltage terminal and the control terminal of the pass gate transistor; and
- a second bias transistor which is coupled in series between the second bias voltage terminal and the control terminal of the pass gate transistor.

5. The integrated circuit buffer of claim 4 wherein:
the pull-up control circuit has first and second complementary pull-up control outputs, wherein the first pull-up control output is coupled to the pull-up control terminal of the pad pull-up transistor;
the first bias transistor has a control terminal which is coupled to the second pull-up control terminal; and
the second bias transistor has a control terminal which is coupled to the first pull-up control terminal.

6. The integrated circuit buffer of claim 3 and further comprising a delay resistor and a voltage supply terminal and wherein:
the second voltage protection transistor comprises a coupling capacitance between its control terminal and the pad terminal;
the delay resistor is coupled between the voltage supply terminal and the control terminal of the second voltage protection transistor; and
the delay resistor and the capacitance of the second voltage protection transistor together form a resistor-capacitor delay circuit between the pad terminal and the voltage supply terminal.

7. The integrated circuit buffer of claim 1 and further comprising:
an enable terminal for receiving an enable signal having an enable state and a disable state;
a first bias terminal for providing a first bias voltage; and
wherein the bias circuit comprises means for coupling the control terminal of the first, pull-up voltage protection transistor to the first bias terminal when the enable signal is in the enable state and for decoupling the control terminal of the first, pull-up voltage protection transistor from the first bias terminal when the enable signal is in the disable state.

8. The integrated circuit buffer of claim 7 wherein the means for coupling comprises:
a second bias terminal for providing a second bias voltage which is greater than the first bias voltage;
a further pass gate transistor which is coupled in series between the first bias terminal and the control terminal of the first, pull-up voltage protection transistor and which has a control terminal operatively coupled to the enable terminal; and
a third voltage protection transistor which is coupled in series between the further pass gate transistor and the control terminal of the first, pull-up voltage protection transistor and which has a control terminal coupled to the second bias terminal.

9. The integrated circuit buffer of claim 1 and further comprising:
a first voltage supply terminal for providing a first supply voltage;
a second voltage supply terminal for providing a second supply voltage which is greater than the first supply voltage;
a third voltage supply terminal for providing a third supply voltage which is greater than the first and second supply voltages;
wherein the pad pull-down transistor comprises an N-channel transistor which is coupled between the pad terminal and the first voltage supply terminal and which has a substrate terminal coupled to the first voltage supply terminal;
wherein the pad pull-up transistor comprises a P-channel transistor which is coupled between the second voltage supply terminal and the first, pull-up voltage protection transistor and which has a well terminal coupled to the third voltage supply terminal; and
wherein the first, pull-up voltage protection transistor comprises a P-channel transistor which has a well terminal coupled to the third voltage supply terminal.

10. The integrated circuit buffer of claim 9 and further comprising:
a fourth voltage supply terminal for providing a fourth supply voltage which is greater than the first supply voltage and less than the second supply voltage;
a third, pull-down voltage protection transistor coupled in series between the pad pull-down transistor and the pad terminal and having a control terminal; and
a resistor coupled between the control terminal of the third, pull-down voltage protection transistor and the fourth voltage supply terminal.

11. The integrated circuit buffer of claim 1 and further comprising:
a core input terminal; and
an input transistor coupled between the pad terminal and the core input terminal.

12. A method of operating a tri-state buffer having a pad pull-down transistor which is coupled to a pad terminal through a pull-down protection transistor and having a pad pull-up transistor which is coupled to the pad terminal through a pull-up protection transistor, the method comprising:
operating the tri-state buffer in a low-impedance drive mode in which the pad pull-down and pad pull-up transistors are biased to selectively couple the pad terminal to a first supply voltage and a second, higher supply voltage through the pad pull-down and pad pull-up transistors, respectively;
operating the tri-state buffer in a high-impedance, tri-state mode in which the pad pull-up and pad pull-down transistors are biased are in an off state;
coupling a voltage on the pad terminal to a control terminal of the pull-up voltage protection transistor through a feedback path when the tri-state buffer is in the high-impedance, tri-state mode and the voltage on the pad terminal exceeds a selected voltage level;
decoupling the voltage on the pad terminal from the control terminal of the pull-up voltage protection transistor through the feedback path when the tri-state buffer is in the high-impedance, tri-state mode and the voltage on the pad terminal is less than the selected voltage level;
coupling the control terminal of the pull-up protection transistor to a first bias voltage, which is greater than the first supply voltage and less than the second supply voltage, when the tri-state buffer is in the low-impedance drive mode; and decoupling the control terminal of the pull-up protection transistor from the first bias voltage when the tri-state buffer is in the high-impedance tri-state mode.

13. The method of claim 12 wherein:

operating the tri-state buffer in a low-impedance drive mode comprises coupling the control terminal of the pull-down voltage protection transistor to a second bias voltage, which is greater than the first bias voltage and less than the second supply voltage.

14. The method of claim 12 wherein the pad pull-down transistor and the pull-down voltage protection transistor are N-channel transistors and the pad pull-up transistor and the pull-up voltage protection transistor are P-channel transistors, and wherein the method further comprises:

coupling a substrate terminal of the pad pull-down transistor and the pull-down voltage protection transistor to the first supply voltage; and coupling a well terminal of the pad pull-up transistor and the pull-up voltage protection transistor to a third supply voltage which is greater than the first and second supply voltages.

15. A method of maintaining an output driver stage of a tri-state buffer in a high-impedance tri-state mode when the voltage on the pad terminal of the buffer exceeds a selected voltage, wherein the output driver stage includes a pad pull-up transistor which is coupled to the pad terminal in series with a pull-up protection transistor, the method comprising:

coupling the voltage on the pad terminal to the control terminal of the pull-up voltage protection transistor through a feedback path comprising a pass gate coupled in series with a feedback protection transistor when the tri-state buffer is in the high-impedance tri-state mode and the voltage on the pad terminal exceeds the selected voltage; and decoupling the voltage on the pad terminal from the control terminal of the pull-up voltage protection transistor through the feedback path by turning the pass gate off when the tri-state buffer is in the high-impedance tri-state mode and the voltage on the pad terminal is less than the selected voltage.

* * * * *